United States Patent
Ryohwa et al.

(10) Patent No.: US 10,174,886 B2
(45) Date of Patent: Jan. 8, 2019

(54) WAVELENGTH CONVERSION MEMBER AND LIGHT EMITTING DEVICE

(71) Applicants: Sharp Kabushiki Kaisha, Sakai-shi, Osaka (JP); National University Corporation Nara Institute of Science and Technology, Ikoma-shi, Nara (JP)

(72) Inventors: Tatsuya Ryohwa, Sakai (JP); Mami Morishita, Sakai (JP); Noriyuki Yamazumi, Sakai (JP); Makoto Izumi, Sakai (JP); Yasutaka Kuzumoto, Sakai (JP); Takuya Nakashima, Ikoma (JP); Tsuyoshi Kawai, Ikoma (JP)

(73) Assignees: SHARP KABUSHIKI KAISHA, Sakai (JP); NATIONAL UNIVERSITY CORPORATION NARA INSTITUTE AND TECHNOLOGY, Nara (JP)

(*) Notice: Subject to any disclaimer, the term of this patent is extended or adjusted under 35 U.S.C. 154(b) by 107 days.

(21) Appl. No.: 15/208,818

(22) Filed: Jul. 13, 2016

(65) Prior Publication Data

US 2017/0030532 A1 Feb. 2, 2017

(30) Foreign Application Priority Data

Jul. 31, 2015 (JP) ................................ 2015-152237
Jul. 31, 2015 (JP) ................................ 2015-152238
Jun. 2, 2016 (JP) ................................ 2016-111081

(51) Int. Cl.
*F21V 9/16* (2006.01)
*F21K 9/64* (2016.01)
(Continued)

(52) U.S. Cl.
CPC .............. *F21K 9/64* (2016.08); *C09K 11/025* (2013.01); *C09K 11/0883* (2013.01);
(Continued)

(58) Field of Classification Search
CPC ... C09K 11/025; C09K 11/703; H01L 33/501; H01L 33/502; H01L 33/504; B82Y 20/00; Y10S 977/774
(Continued)

(56) References Cited

U.S. PATENT DOCUMENTS

2006/0120021 A1 6/2006 Banno et al.
2009/0272996 A1 11/2009 Chakraborty
(Continued)

FOREIGN PATENT DOCUMENTS

DE 10 2012 105 782 A1 1/2014
JP 2003-512404 A 4/2003
(Continued)

OTHER PUBLICATIONS

Nakashima et al., "Quantum dots-ionic liquid hybrids: efficient extraction of cationic CdTe Nanocrystals into an ionic liquid", Chem. Communication, Feb. 1, 2005, pp. 1643-1645.
(Continued)

*Primary Examiner* — Daniel St Cyr
(74) *Attorney, Agent, or Firm* — Keating & Bennett, LLP

(57) ABSTRACT

A light emitting device includes a light source and a wavelength converter that includes a resin including a constitutional unit that includes an ionic liquid or a derivative of the ionic liquid, and a semiconductor nanoparticle phosphor included in the resin and provided on at least a portion of the light source. A wavelength converter includes a resin including a constitutional unit that includes an ionic liquid or a derivative of the ionic liquid, and a semiconductor nanoparticle phosphor included in the resin and emitting fluorescence upon receiving excitation light. A light emitting device includes the wavelength converter and a light source emitting excitation light to the wavelength converter, which is provided separately from the wavelength converter.

3 Claims, 10 Drawing Sheets

(51) Int. Cl.

| | | |
|---|---|---|
| *C09K 11/02* | (2006.01) | |
| *C09K 11/88* | (2006.01) | |
| *C09K 11/70* | (2006.01) | |
| *C09K 11/64* | (2006.01) | |
| *C09K 11/08* | (2006.01) | |
| *H01L 33/50* | (2010.01) | |
| *F21Y 115/10* | (2016.01) | |
| *F21Y 115/30* | (2016.01) | |

(52) U.S. Cl.
CPC ......... *C09K 11/646* (2013.01); *C09K 11/703* (2013.01); *C09K 11/883* (2013.01); *H01L 33/501* (2013.01); *F21Y 2115/10* (2016.08); *F21Y 2115/30* (2016.08); *H01L 33/502* (2013.01); *H01L 33/504* (2013.01); *H01L 33/507* (2013.01)

(58) Field of Classification Search
USPC .................................................... 362/84, 85
See application file for complete search history.

(56) References Cited

U.S. PATENT DOCUMENTS

| | | | |
|---|---|---|---|
| 2010/0044640 A1* | 2/2010 | Agrawal | C08G 59/30 252/301.36 |
| 2010/0123155 A1* | 5/2010 | Pickett | B82Y 15/00 257/98 |
| 2010/0163798 A1* | 7/2010 | Ryowa | C09K 11/02 252/301.4 R |
| 2012/0061609 A1 | 3/2012 | Yin et al. | |
| 2013/0189803 A1* | 7/2013 | Nasaani | C09K 11/02 438/27 |
| 2013/0271961 A1 | 10/2013 | Nakamura | |
| 2014/0030507 A1 | 1/2014 | Yoshida et al. | |
| 2014/0240644 A1 | 8/2014 | Abe | |
| 2014/0246689 A1 | 9/2014 | Luo et al. | |
| 2016/0072026 A1 | 3/2016 | Kanaumi | |
| 2017/0167693 A1* | 6/2017 | Yamazumi | C09K 11/08 |

FOREIGN PATENT DOCUMENTS

| | | |
|---|---|---|
| JP | 2003-253311 A | 9/2003 |
| JP | 2008-007815 A | 1/2008 |
| JP | 2009-272634 A | 11/2009 |
| JP | 2010-160952 A | 7/2010 |
| JP | 2010-232203 A | 10/2010 |
| JP | 2012-518811 A | 8/2012 |
| JP | 2013-506718 A | 2/2013 |
| JP | 2013-218952 A | 10/2013 |
| JP | 2014-056896 A | 3/2014 |
| JP | 2014-141649 A | 8/2014 |
| JP | 2014-165116 A | 9/2014 |
| JP | 2014-169421 A | 9/2014 |
| JP | 2014-170938 A | 9/2014 |
| JP | 2015-113360 A | 6/2015 |
| KR | 10-2012-0067541 A | 6/2012 |
| KR | 10-2014-0108299 A | 9/2014 |
| WO | 01/30304 A1 | 5/2001 |
| WO | 2004/027789 A1 | 4/2004 |
| WO | 2006/054402 A1 | 5/2006 |
| WO | 2011/025847 A2 | 3/2011 |
| WO | 2012/132239 A1 | 10/2012 |

OTHER PUBLICATIONS

Nakashima et al., "Ionic liquid-based luminescent composite materials", Polymers for Advanced Technologies, vol. 19, Jul. 15, 2008, pp. 1401-1405.

Nakashima et al., "Highly Luminescent CdTe Nanocrystal-Polymer Composites Based on Ionic Liquid", Chemistry Letters, vol. 34, No. 10, 2005, pp. 1410-1411.

* cited by examiner

WAVELENGTH CONVERSION MEMBER AND LIGHT EMITTING DEVICE

CROSS REFERENCE TO RELATED APPLICATIONS

This application claims the benefit of priority to Japanese Patent Application Numbers 2015-152237, 2015-152238 and 2016-111081 filed on Jul. 31, 2015, Jun. 2, 2016 and Jun. 2, 2016, respectively. The entire contents of each of the above-identified applications are hereby incorporated by reference.

BACKGROUND OF THE INVENTION

1. Field of the Invention

The present invention relates to a light emitting device including a light source and a wavelength converter in which a semiconductor nanoparticle phosphor is dispersed in a resin formed by polymerization of an ionic liquid including a polymerizable functional group.

The present invention also relates to a wavelength converter in which a semiconductor nanoparticle phosphor is dispersed in a resin formed by polymerization of an ionic liquid including a polymerizable functional group and to a light emitting device including the wavelength converter and a light source.

2. Description of the Related Art

A light emitting device including a semiconductor nanoparticle phosphor has recently been developed as a next-generation light emitting device. By using particles having a nanoparticle size as a phosphor, improvement in light emission efficiency and high color rendering properties as compared with a conventional phosphor are expected. Furthermore, a semiconductor nanoparticle phosphor allows easy control of a fluorescence wavelength, that is, a fluorescence color, based on a change in particle size thereof.

When such a semiconductor nanoparticle phosphor is employed for a wavelength converter of a light emitting device, the semiconductor nanoparticle phosphor should be dispersed in a layer of a solid such as a resin. Unless the semiconductor nanoparticle phosphor dispersed in the resin is protected against external air or moisture, however, efficiency of the semiconductor nanoparticle phosphor will be lowered by influences thereof. Therefore, for example, Japanese Patent Laying-Open No. 2014-169421 discloses a phosphor having a core portion formed of a semiconductor nanoparticle phosphor and a shell portion covering the outside of the core portion and/or filling a gap between the core portions. Japanese Patent Laying-Open No. 2014-169421 uses silica for the shell portion and more preferably uses silica obtained as a result of a condensation reaction of alkoxysilane. With the method described in Japanese Patent Laying-Open No. 2014-169421, however, decreases in efficiency of the semiconductor nanoparticle phosphor have occurred in the step of covering the semiconductor nanoparticle phosphor with silica.

For example, Japanese Patent Laying-Open No. 2014-170938 discloses, as one of light emitting devices including a semiconductor nanoparticle phosphor, a lighting device including a light source, a first phosphor layer disposed on the light source, a quantum layer containing quantum dots (a semiconductor nanoparticle phosphor) disposed on the first phosphor layer, and a second phosphor layer disposed on the quantum layer. According to Japanese Patent Laying-Open No. 2014-170938, with such a lighting device, a desired color and uniformity in output light can be controlled by using the conventional phosphor and quantum dots. According to Japanese Patent Laying-Open No. 2014-170938, the quantum layer can be formed, for example, by applying an uncured base material (a matrix material) such as condensation curable silicone and methyl polymethacrylate with quantum dots (a semiconductor nanoparticle phosphor) being dispersed therein and drying the base material by curing the base material.

When a semiconductor nanoparticle phosphor is employed for a wavelength converter of a light emitting device, the semiconductor nanoparticle phosphor should be dispersed in a layer of a solid such as a resin. In the light emitting device including the semiconductor nanoparticle phosphor, however, for example, when a first phosphor layer is disposed adjacently to the light source and the quantum layer is disposed adjacently to the first phosphor layer as in the example disclosed in Japanese Patent Laying-Open No. 2014-170938, disadvantageously, heat generated from the light source conducts to the wavelength converter including the semiconductor nanoparticle phosphor and thus, the semiconductor nanoparticle phosphor is deteriorated.

SUMMARY OF THE INVENTION

Preferred embodiments of the present invention provide a light emitting device including a semiconductor nanoparticle phosphor, in which the semiconductor nanoparticle phosphor is protected against influences due to external air or moisture, and also provide a wavelength converter included therein.

Preferred embodiments of the present invention also provide a light emitting device including a semiconductor nanoparticle phosphor, in which deterioration of the semiconductor nanoparticle phosphor, in particular due to heat, is significantly reduced or prevented.

A light emitting device according to a preferred embodiment of the present invention includes a light source and a wavelength converter which includes a resin including a constitutional unit that includes an ionic liquid or a derivative of the ionic liquid, and a semiconductor nanoparticle phosphor included in the resin and provided on at least a portion of the light source.

The ionic liquid preferably includes a polymerizable functional group.

In the light emitting device according to a preferred embodiment of the present invention, a semiconductor nanoparticle phosphor is included in a resin including a constitutional unit that includes an ionic liquid or a derivative of the ionic liquid, so that the semiconductor nanoparticle phosphor is protected by the resin and deterioration of the semiconductor nano phosphor, in particular due to heat, is significantly reduced or prevented. Therefore, in the light emitting device according to a preferred embodiment of the present invention, the semiconductor nanoparticle phosphor is sealed in a solid in a stable manner. Even when a wavelength converter including the semiconductor nanoparticle phosphor is provided on or integrally covers at least a portion of the light source, deterioration of the semiconductor nanoparticle phosphor due to heat generated from the light source is significantly reduced or prevented, efficiency in light emission is not decreased, and a light emitting device high in efficiency is provided.

In the light emitting device according to a preferred embodiment of the present invention, the wavelength converter preferably is provided on or integrally covers at least a portion of the light source (in other words, the wavelength converter and the light source are integrally formed), which achieves space savings and allows for replacement of a conventional white LED chip with the light emitting device according to a preferred embodiment of the present invention. Furthermore, since the wavelength converter and the light source are integrally formed, advantageously, an amount of phosphor used is small while control of light distribution is easy.

Another preferred embodiment of the present invention provides a wavelength converter which includes a resin including a constitutional unit that includes an ionic liquid or a derivative of the ionic liquid, and a semiconductor nanoparticle phosphor included in the resin and emits fluorescence upon receiving excitation light.

The ionic liquid preferably includes a polymerizable functional group.

Another preferred embodiment of the present invention provides a light emitting device including the wavelength converter according to one of the preferred embodiments of the present invention and a light source emitting excitation light to the wavelength converter, which is provided separately from the wavelength converter (hereinafter the light emitting device being referred to as a "light emitting device according to a preferred embodiment of the present invention").

In a wavelength converter according to a preferred embodiment of the present invention and a light emitting device according to a preferred embodiment of the present invention including such a wavelength converter, a semiconductor nanoparticle phosphor is dispersed in a resin including a constitutional unit that includes an ionic liquid or a derivative of the ionic liquid, so that the semiconductor nanoparticle phosphor is protected by the resin and deterioration of the semiconductor nanoparticle phosphor due to the effects of external air or moisture is significantly reduced or prevented.

Since the light emitting device according to a preferred embodiment of the present invention preferably includes the wavelength converter and the light source separate from the wavelength converter, a degree of freedom in design of a shape or design for heat radiation is advantageously high. In particular, heat is able to be radiated from each of the wavelength converter and the light source, so that heat radiation capability is high. Furthermore, the wavelength converter is separate from an excitation light source which emits heat, so that advantageously heat from the light source is less likely to conduct to the wavelength converter and deterioration of the wavelength converter is significantly reduced or prevented. Since the wavelength converter and the light source are separate from each other, yield is high and the light emitting device is able to be readily and easily repaired in the case of a failure by replacing each component.

In any of the light emitting devices according to a preferred embodiment of the present invention and the light emitting devices according to a preferred embodiment of the present invention, the polymerizable functional group preferably is a (meth)acrylic acid ester group, and more preferably, the ionic liquid having the acrylic acid ester group is 2-(methacryloyloxy)-ethyltrimethylammonium bis(trifluoromethanesulfonyl) imide or 1-(3-acryloyloxy-propyl)-3-methylimidazolium bis(trifluoromethanesulfonyl) imide.

In any of the light emitting devices according to a preferred embodiment of the present invention and the light emitting devices according to a preferred embodiment of the present invention, preferably, the semiconductor nanoparticle phosphor emits visible light having a wavelength from about 380 nm to about 780 nm, and more preferably, the semiconductor nanoparticle phosphor includes at least one material selected from the group consisting of InP, InN, InAs, InSb, InBi, ZnO, $In_2O_3$, $Ga_2O_3$, $ZrO_2$, $In_2S_3$, $Ga_2S_3$, $In_2Se_3$, $Ga_2Se_3$, $In_2Te_3$, $Ga_2Te_3$, CdSe, CdTe, and CdS.

In any of the light emitting devices according to a preferred embodiment of the present invention and the light emitting devices according to a preferred embodiment of the present invention, the semiconductor nanoparticle phosphor may include a first semiconductor nanoparticle phosphor which emits red light and a second semiconductor nanoparticle phosphor which emits green light. In this case, preferably, the wavelength converter in the light emitting devices according to a preferred embodiment of the present invention or the wavelength converter in the light emitting devices according to a preferred embodiment of the present invention include a first wavelength conversion layer and a second wavelength conversion layer successively from a side closer to the light source, and any one of the first wavelength conversion layers and the second wavelength conversion layers include the first semiconductor nanoparticle phosphor which emits red light and the other layers thereof include the second semiconductor nanoparticle phosphor which emits green light. In this case, more preferably, the first wavelength conversion layer includes the first semiconductor nanoparticle phosphor which emits red light and the second wavelength conversion layer includes the second semiconductor nanoparticle phosphor which emits green light. In this case, preferably, the light source emits blue light and the light emitting device emits white light.

In any of the light emitting devices according to a preferred embodiment of the present invention and the light emitting devices according to a preferred embodiment of the present invention, the semiconductor nanoparticle phosphor may include a surface bonded to an ionic surface modifying molecule. In this case, more preferably, the ionic surface modifying molecule is any selected from the group consisting of 2-(diethylamino)ethanethiol hydrochloride, hexadecyltrimethylammonium bromide, myristyltrimethylammonium bromide, and thiocholine bromide.

A wavelength converter in a light emitting device according to a preferred embodiment of the present invention or a wavelength converter in a light emitting device according to a preferred embodiment of the present invention may further include a phosphor other than the semiconductor nanoparticle phosphor. In this case, preferably, the phosphor other than the semiconductor nanoparticle phosphor is at least any of a $CaAlSiN_3$ red phosphor and a YAG:Ce yellow phosphor.

Any of the light emitting devices according to a preferred embodiment of the present invention and the light emitting devices according to a preferred embodiment of the present invention may further include a translucent gas barrier layer. In this case, preferably, the gas barrier layer includes any material selected from the group consisting of glass, a silicone resin, and an acrylic resin, and a scattering agent including an inorganic material may be dispersed in the gas barrier layer.

In any of the light emitting devices according to a preferred embodiment of the present invention and the light emitting devices according to a preferred embodiment of the present invention, preferably, the semiconductor nanoparticle phosphor is dispersed in the resin to define an assembly with a cluster structure. In this case, preferably, the semiconductor nanoparticle phosphor is dispersed in the resin without contact between the semiconductor nanoparticle phosphors. In this case, more preferably, in the assembly with the cluster structure, a linear distance between the semiconductor nanoparticle phosphors most proximate to each other is not greater than 10 nm.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
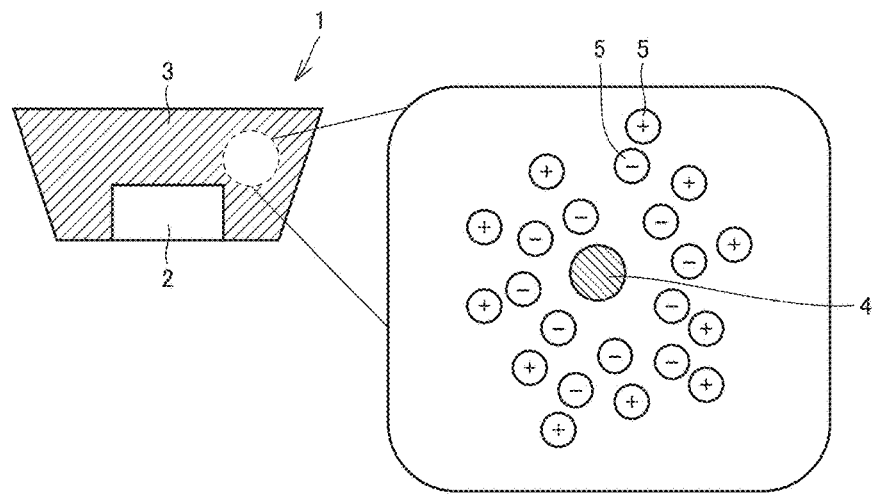
FIG. 1 is a cross-sectional view of alight emitting device according to a preferred embodiment of the present invention.

FIG. 1 is a diagram schematically showing a light emitting device according to a preferred embodiment of the present invention. A light emitting device 1 in an example shown in FIG. 1 preferably includes a light source 2 and a wavelength converter 3 integrally covering at least a portion of light source 2. Here, "integrally covering" refers to a structure in which wavelength converter 3 is secured to at least a portion of light source 2 (preferably, an upper surface and a side surface of light source 2 as in the example shown in FIG. 1) and seals the portion of the light source.

Here, FIG. 1 schematically shows wavelength converter 3 as being partially enlarged, on the right side of the drawing. Wavelength converter 3 in the light emitting device according to a preferred embodiment of the present invention is provided with a semiconductor nanoparticle phosphor 4 dispersed in a resin (polymer) 5 including a constitutional unit that includes an ionic liquid or a derivative of the ionic liquid including a polymerizable functional group. In the light emitting device according to a preferred embodiment of the present invention, the semiconductor nanoparticle phosphor is thus dispersed in the resin including the constitutional unit that includes the ionic liquid or the derivative of the ionic liquid including the polymerizable functional group, so that the semiconductor nanoparticle phosphor is protected by the resin and deterioration of the semiconductor nano phosphor in particular due to heat is significantly reduced or prevented. Therefore, in the light emitting device according to a preferred embodiment of the present invention, the semiconductor nanoparticle phosphor is sealed in a solid in a stable manner. Even when the wavelength converter including the semiconductor nanoparticle phosphor is formed to integrally cover at least a portion of the light source, deterioration of the semiconductor nanoparticle phosphor due to heat generated from the light source is significantly reduced or prevented, efficiency in light emission is not decreased, and a light emitting device high in efficiency is able to be provided.

In the light emitting device according to a preferred embodiment of the present invention, the wavelength converter preferably is provided on or integrally covers at least a portion of the light source (in other words, the wavelength converter and the light source are integrally formed), so that a space occupied by the light emitting device when it is used as a backlight is significantly reduced and a conventional white LED chip is able to be replaced with the light emitting device according to a preferred embodiment of the present invention (for example, in the case of the backlight, it can be manufactured through conventional steps, for example). Furthermore, since the wavelength converter and the light source are integrally formed, advantageously, an amount of use of a phosphor is small while control of light distribution is easy.

Figure 2:
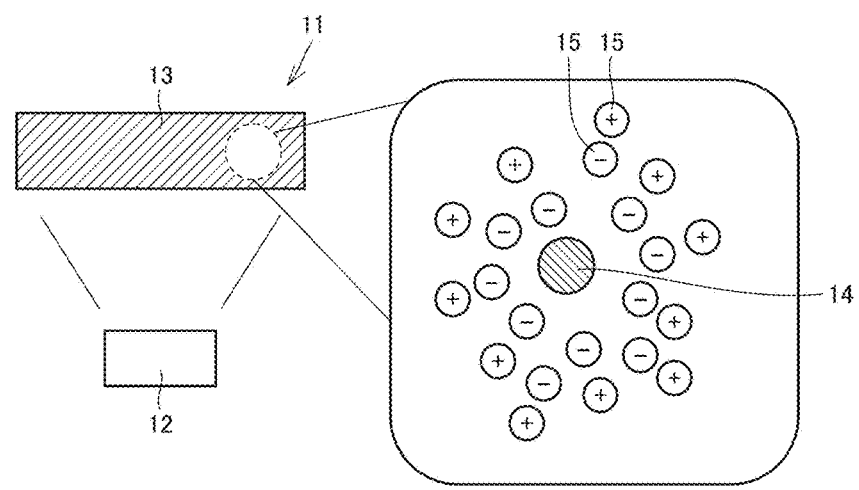
FIG. 2 is a cross-sectional view of alight emitting device according to a preferred embodiment of the present invention.

FIG. 2 is a diagram schematically showing a preferred embodiment of a light emitting device according to a preferred embodiment of the present invention. A light emitting device 11 in an example shown in FIG. 2 basically includes a light source (an excitation light source) 12 and a wavelength converter 13 provided separately from light source 12. Here, "separate" refers to members being individual and not integrally formed. Though various preferred embodiments of the present invention provide the entire light emitting device 11 according to a preferred embodiment of the present invention shown in FIG. 2, wavelength converter 13 is also provided as a preferred embodiment of the present invention.

FIG. 2 schematically shows wavelength converter 13 as being partially enlarged, on the right side of the drawing. Wavelength converter 13 according to a preferred embodiment of the present invention is provided with a semiconductor nanoparticle phosphor 14 dispersed in a resin (polymer) 15 including a constitutional unit that includes an ionic liquid or a derivative of the ionic liquid including a polymerizable functional group, and emits fluorescence upon receiving excitation light. In the wavelength converter according to a preferred embodiment of the present invention, the semiconductor nanoparticle phosphor is thus dispersed in the resin including the constitutional unit that includes the ionic liquid or the derivative of the ionic liquid including the polymerizable functional group, so that the semiconductor nanoparticle phosphor is protected by the resin and deterioration of the semiconductor nanoparticle phosphor due to the effects of external air or moisture is significantly reduced or prevented.

Since a light emitting device according to a preferred embodiment of the present invention includes the wavelength converter and the light source separate from the wavelength converter, a degree of freedom in design of a shape or design for heat radiation is advantageously high. In particular, heat is able to be radiated from each of the wavelength converter and the light source, so that heat radiation capability is high. Furthermore, the wavelength converter is separate from the light source which emits heat, so that advantageously heat from an excitation light source is less likely to conduct to the wavelength converter and deterioration of the wavelength converter is significantly reduced or prevented. Since the wavelength converter and the light source are separate from each other, yield is high and the light emitting device is able to be readily and easily repaired in the case of a failure by replacing each component.

The "ionic liquid" included in wavelength converters according to various preferred embodiments of the present invention described above as well as in light emitting devices according to preferred embodiments of the present invention is preferably a salt in a molten state even at an ambient temperature (for example, about 25° C.) (ambient temperature molten salt) which is expressed in a general formula (I) below.

$$X^+Y^- \quad (I)$$

In the general formula (I), $X^+$ (a component shown with + surrounded by a circle on the right in FIG. 1) is a cation selected from among imidazolium ion, pyridinium ion, phosphonium ion, aliphatic quaternary ammonium ion, pyrrolidinium, and sulfonium. Among these, for excellent stability against air and moisture in atmosphere, aliphatic quaternary ammonium ion is a particularly preferred cation.

In the general formula (I), $Y^-$ (a component shown with − surrounded by a circle on the right in FIG. 1) is an anion selected from among tetrafluoroboric acid ion, hexafluorophosphoric acid ion, bis((trifluoromethyl)sulfonyl) imide acid ion, perchloric acid ion, tris(trifluoromethylsulfonyl) carbon acid ion, trifluoromethanesulfonic acid ion, trifluoroacetic acid ion, carbonic acid ion, and halogen ion. Among these, for excellent stability against air and moisture in atmosphere, bis((trifluoromethyl)sulfonyl) imide acid ion is a particularly preferred anion.

The ionic liquid used in wavelength converter 13 and light emitting devices 1 and 11 according to various preferred embodiments of the present invention includes a polymerizable functional group. By including the ionic liquid including the polymerizable functional group, the ionic liquid functioning as a dispersion medium for the semiconductor nanoparticle phosphor is able to be polymerized as it is in the presence of the polymerizable functional group. Thus, by providing the resin including the constitutional unit that includes the ionic liquid or the derivative of the ionic liquid including the polymerizable functional group by polymerizing the ionic liquid including the polymerizable functional group with the semiconductor nanoparticle phosphor being dispersed, agglomeration which has occurred in solidification of the resin in which the semiconductor nanoparticle phosphor has been dispersed is significantly reduced or prevented. As described above, the semiconductor nanoparticle phosphor is dispersed in the resin including the constitutional unit that includes the ionic liquid or the derivative of the ionic liquid including the polymerizable functional group, so that the semiconductor nanoparticle phosphor is electrostatically stabilized, the semiconductor nanoparticle phosphor is reliably and securely protected, the surface of the semiconductor nanoparticle phosphor is protected against the effects of air and moisture, and a light emitting device high in efficiency in light emission is realized.

The polymerizable functional group of the ionic liquid is not particularly restricted. For polymerization by heating or catalyst reaction, a (meth)acrylic acid ester group (a (meth) acryloyloxy group) is preferred because the semiconductor nanoparticle phosphor is able to be solidified with a dispersed state being maintained from a state of a liquid in which stable dispersion is achieved.

To achieve excellent thermal stability and stability in atmosphere, suitable examples of the ionic liquid including such a (meth)acrylic acid ester group include 2-(methacryloyloxy)-ethyltrimethylammonium bis(trifluoromethanesulfonyl) imide shown in a formula below and

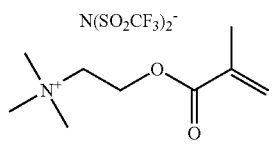

1-(3-acryloyloxy-propyl)-3-methylimidazolium bis(trifluoromethanesulfonyl) imide shown in a formula below.

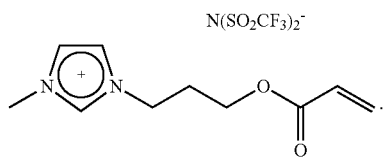

The ionic liquid including the polymerizable functional group as described above is able to be obtained by introducing a polymerizable functional group into a conventionally known appropriate ionic liquid with a conventionally known appropriate method, however, a commercially available product may naturally be used.

Suitable conditions in accordance with a type or an amount of an ionic liquid including a polymerizable functional group to be used are selected as appropriate as conditions for a temperature and a time period for polymerization of the ionic liquid including the polymerizable functional group while the semiconductor nanoparticle phosphor is dispersed, and the conditions are not particularly restricted. For example, when 2-(methacryloyloxy)-ethyltrimethylammonium bis(trifluoromethanesulfonyl) imide may preferably be used as the ionic liquid including the polymerizable functional group, polymerization can suitably be achieved, for example, under a condition of a temperature from 60 to 100° C. for 1 to 10 hours. When 1-(3-acryloyloxy-propyl)-3-methylimidazolium bis(trifluoromethanesulfonyl) imide is used as the ionic liquid including the polymerizable functional group, polymerization is able to be suitably achieved, for example, under a condition of a temperature from about 60° C. to about 150° C. for about 1 hour to about 10 hours.

When a catalyst is used in polymerization, a catalyst to be used is not particularly restricted, and for example, conventionally known azobisisobutyronitrile or dimethyl 2,2'-azobis(2-methylpropionate) can be used. Of these, for rapid progress of polymerization, azobisisobutyronitrile is preferably used as a catalyst.

In polymerization of the ionic liquid including the polymerizable functional group, a cross-linking agent may be added. By adding the cross-linking agent, advantageously, a resin higher in strength is able to be obtained as the resin including the constitutional unit that includes the obtained ionic liquid or the derivative of the obtained ionic liquid including the polymerizable functional group and stability of the wavelength converter is improved. Examples of the cross-linking agent include diethyleneglycol dimethacrylate and 1,1,1-trimethylol propane triacrylate, and the cross-linking agent is not particularly restricted. Of these, for such a reason that there are many cross-linking sites and secure polymerization is achieved, 1,1,1-trimethylol propane triacrylate is preferably used as the cross-linking agent.

When a cross-linking agent is added, an amount of addition is not particularly restricted either, however, an amount of addition is preferably within a range from 1 to 50 parts by weight and more preferably within a range from 10 to 30 parts by weight with respect to 100 parts by weight of the ionic liquid including the polymerizable functional group. When an amount of addition of the cross-linking agent is smaller than 1 part by weight with respect to 100 parts by weight of the ionic liquid including the polymerizable functional group, a cross-linking structure does not tend to develop and strength of the resin tends to be weak. When an amount of addition of the cross-linking agent exceeds 50 parts by weight with respect to 100 parts by weight of the ionic liquid including the polymerizable functional group, the semiconductor nanoparticle phosphor does not tend to be dispersed in a stable manner.

For semiconductor nanoparticle phosphors 4 and 14 in wavelength converter 13 according to a preferred embodiment of the present invention as well as in light emitting device 1 and light emitting device 11 according to other preferred embodiments of the present invention, a conventionally known appropriate semiconductor nanoparticle phosphor is able to be used without being particularly restricted. By using the semiconductor nanoparticle phosphor, advantageously, an emission wavelength is able to be precisely controlled based on control of a composition.

Semiconductor nanoparticle phosphors 4 and 14 used in wavelength converter 13 according to a preferred embodiment of the present invention as well as in light emitting device 1 and light emitting device 11 according to other preferred embodiments of the present invention preferably emit visible light including a wavelength from about 380 nm to about 780 nm, for example, for use as general lighting or a light source for a liquid crystal backlight. When a semiconductor nanoparticle phosphor emitting light including a wavelength shorter than about 380 nm is used, ultraviolet rays are emitted, which cannot be used for general lighting or the light source for the liquid crystal backlight. When a semiconductor nanoparticle phosphor emitting light including a wavelength exceeding about 780 nm is used, near infrared or infrared rays are emitted as light, which cannot be used for general lighting or the light source for the liquid crystal backlight.

A source material for the semiconductor nanoparticle phosphor is not particularly restricted and includes at least any one material selected from the group consisting of InP, InN, InAs, InSb, InBi, ZnO, $In_2O_3$, $Ga_2O_3$, $ZrO_2$, $In_2S_3$, $Ga_2S_3$, $In_2Se_3$, $Ga_2Se_3$, $In_2Te_3$, $Ga_2Te_3$, CdSe, CdTe, CdS, ZnO, $CuInS_2$, $CuInSe_2$, and $CuInTe_2$ which have conventionally been used as the semiconductor nanoparticle phosphors. Among these, for such a reason as excellent visible light emission characteristics and stability, at least any one material selected from the group consisting of InP, InN, InAs, InSb, InBi, ZnO, $In_2O_3$, $Ga_2O_3$, $ZrO_2$, $In_2S_3$, $Ga_2S_3$, $In_2Se_3$, $Ga_2Se_3$, $In_2Te_3$, $Ga_2Te_3$, CdSe, CdTe, and CdS is preferably contained and at least any one material selected from among CdSe, CdTe, and InP is particularly preferably contained.

A shape of the semiconductor nanoparticle phosphor is not particularly restricted and a semiconductor nanoparticle phosphor including a conventionally known appropriate shape such as a spherical shape, a rod shape, or a wire shape, for example, can be used without particularly being restricted. In particular, from a point of view of ease in control of light emission characteristics based on control of a shape, a spherical semiconductor nanoparticle phosphor is preferably used, for example.

A particle size of the semiconductor nanoparticle phosphor can be selected as appropriate in accordance with a source material and a desired emission wavelength, without being particularly restricted, however, it is preferably within a range from about 1 nm to about 20 nm and more preferably within a range from about 2 nm to about 5 nm, for example. When the semiconductor nanoparticle phosphor has a particle size smaller than about 1 nm, a ratio of a surface area to a volume tends to increase, a surface defect tends to be dominant, and an effect tends to be lowered. When the semiconductor nanoparticle phosphor has a particle size exceeding about 20 nm, a state of dispersion tends to be low and agglomeration and settling tend to occur. When the semiconductor nanoparticle phosphor has a spherical shape, the particle size refers, for example, to an average particle size measured with a particle size distribution analyzer or to a size of a particle observed with an electron microscope. When the semiconductor nanoparticle phosphor has a rod shape, the particle size refers, for example, to a length of a minor axis and a major axis measured with an electron microscope. When the semiconductor nanoparticle phosphor has a wire shape, the particle size refers, for example, to a length of a minor axis and a major axis measured with an electron microscope.

Though a content of the semiconductor nanoparticle phosphor (a total amount when two or more types of semiconductor nanoparticle phosphors are used as will be described later) is not particularly restricted, the content is preferably within a range from about 0.001 to about 50 parts by weight and more preferably within a range from about 0.01 to about 20 parts by weight, for example, with respect to 100 parts by weight of the ionic liquid including the polymerizable functional group. When a content of the semiconductor nanoparticle phosphor is smaller than about 0.001 part by weight with respect to 100 parts by weight of the ionic liquid including the polymerizable functional group, light emission from the semiconductor nanoparticle phosphor tends to be excessively weak. When a content of the semiconductor nanoparticle phosphor exceeds about 50 parts by weight with respect to 100 parts by weight of the ionic liquid including the polymerizable functional group, uniform dispersion in the ionic liquid including the polymerizable functional group tends to be difficult.

Figure 3:
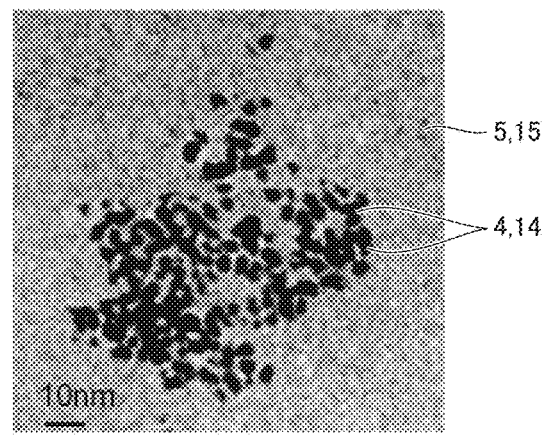
FIG. 3 is a transmission electron microscope photograph showing a wavelength converter 3 according to a preferred embodiment of the present invention as well as semiconductor nanoparticle phosphors 4 and 14 and resins 5 and 15 in a light emitting device 1 according to a preferred embodiment of the present invention and a light emitting device 11 according to a preferred embodiment of the present invention shown in a partially enlarged portion.

FIG. 3 is a transmission electron microscope (TEM) photograph (×100,000) showing semiconductor nanoparticle phosphors 4 and 14 and resins 5 and 15 in wavelength converter 3 as well as in light emitting device 1 and light emitting device 11 according to various preferred embodiments of the present invention, as being partially enlarged. In various preferred embodiments of the present invention, the semiconductor nanoparticle phosphor preferably is dispersed in the resin to define a cluster structure (what is called self-organization). In various preferred embodiments of the present invention, the constitutional unit that includes the ionic liquid or the derivative of the ionic liquid which forms the resin surrounds the semiconductor nanoparticle phosphor, so that the semiconductor nanoparticle phosphors are dispersed to define a cluster structure with a moderate proximate distance being maintained therebetween due to electrostatic repulsion. Thus, in various preferred embodiments of the present invention, since the semiconductor nanoparticle phosphors are electrostatically repulsive to each other and do not agglomerate, lowering in efficiency in light emission due to agglomeration of the semiconductor nanoparticle phosphors which has conventionally occurred when the semiconductor nanoparticle phosphor is dispersed in the resin does not take place.

Though FIG. 3 shows such a state that the semiconductor nanoparticle phosphors define an assembly including a cluster structure in a portion of the resin, the assembly with the cluster structure should only be present in at least a portion of the resin or an assembly with a cluster structure may be provided in the entire resin.

Figure 4:
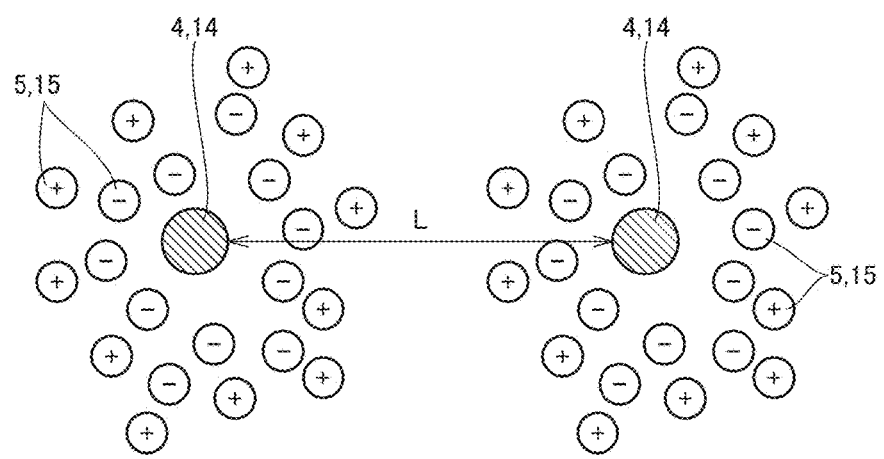
FIG. 4 is a diagram schematically showing a partially enlarged photograph shown in FIG. 3.

FIG. 4 is a diagram schematically showing a partially enlarged photograph shown in FIG. 3. A relationship of $0 < L \leq 10$ nm is preferably satisfied, where L represents a linear distance between the semiconductor nanoparticle phosphors most proximate to each other in the assembly with the cluster structure. In a preferred embodiment of the present invention, the semiconductor nanoparticle phosphor in the resin may include a portion where the semiconductor nanoparticle phosphors are in contact with each other, however, the semiconductor nanoparticle phosphors are preferably dispersed without being in contact with each other and a lower limit of linear distance L is expressed as $0 < L$. Thus, inactivation at a surface (a grain boundary) due to contact between the semiconductor nanoparticle phosphors which has conventionally occurred when the semiconductor nanoparticle phosphor is sealed in a solid is significantly reduced or prevented and high efficiency in light emission is able to be maintained. In particular, when a concentration of the semiconductor nanoparticle phosphors in a state of being sealed in a solid is high, a density of the semiconductor nanoparticle phosphors is high, possibility of contact is high, inactivation is noticeable, and efficiency in light emission is significantly lowered. According to various preferred embodiments of the present invention, however, with the use of the resin including the constitutional unit that includes the ionic liquid or the derivative of the ionic liquid, even when a concentration of the semiconductor nanoparticle phosphors in the state of being sealed in a solid is high, contact between the semiconductor nanoparticle phosphors and inactivation thereof is significantly reduced or prevented and lowering in efficiency in light emission is able to be prevented. Whether or not the semiconductor nanoparticle phosphors in the resin are in contact with each other can be checked through observation with a TEM described above.

When the upper limit of linear distance L exceeds about 10 nm, the semiconductor nanoparticle phosphors tend to be present without interacting with each other. For such a reason that a stable state resulting from formation of the assembly with the cluster structure (self-organization) is able to be effectively maintained, a range of $1 \text{ nm} \leq L \leq 5$ nm is more preferred, for example.

Though a thickness of the wavelength converter is not particularly restricted in various preferred embodiments of the present invention, the thickness is preferably within a range from about 10 µm to about 200 µm and more preferably within a range from about 30 µm to about 100 µm, for example.

In various preferred embodiments of the present invention, a concentration of the semiconductor nanoparticle phosphors is high without agglomeration thereof as described above, so that a thickness of the wavelength converter is able to be advantageously decreased. When the wavelength converter has a thickness smaller than about 10 µm, a concentration of the semiconductor nanoparticle phosphors tends to be high and fabrication thereof tends to be difficult. When the wavelength converter has a thickness exceeding about 200 µm, such a thickness tends to be out of the scope of the object to achieve a smaller thickness in application to an actual light emitting device.

Figure 5:
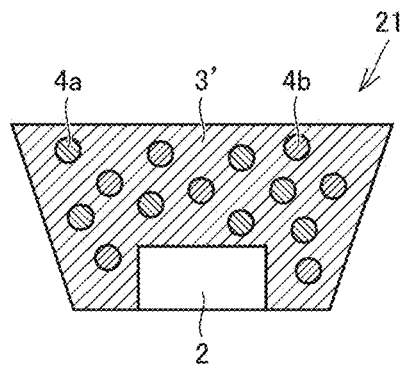
FIG. 5 is a cross-sectional view of a light emitting device according to a preferred embodiment of the present invention.

FIG. 5 is a diagram schematically showing a light emitting device according to another preferred embodiment of the present invention. Though FIG. 1 shows the example in which only one type of semiconductor nanoparticle phosphor preferably is used, the semiconductor nanoparticle phosphor may include a first semiconductor nanoparticle phosphor which emits red light and a second semiconductor nanoparticle phosphor which emits green light as in an example shown in FIG. 5. FIG. 5 schematically shows a light emitting device 21 in which a wavelength converter 3' that is provided on or integrally covers at least a portion of light source 2 includes two types of semiconductor nanoparticle phosphors (a first semiconductor nanoparticle phosphor 4a which emits red light and a second semiconductor nanoparticle phosphor 4b which emits green light) by way of example.

Figure 6:
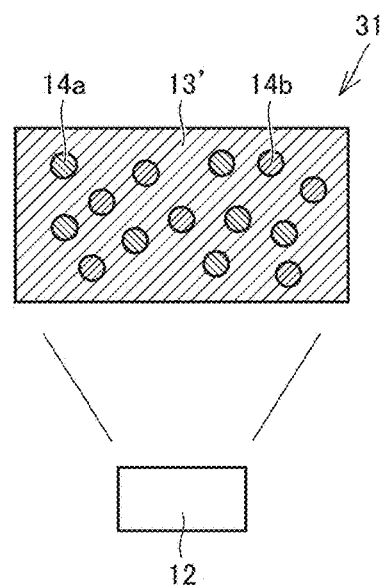
FIG. 6 is a cross-sectional view of a light emitting device according to a preferred embodiment of the present invention.

FIG. 6 is a diagram schematically showing a light emitting device according to a further preferred embodiment of the present invention. FIG. 6 shows a light emitting device 31 including a wavelength converter 13' according to the further preferred embodiment of the present invention. Though FIG. 2 shows the example in which only one type of semiconductor nanoparticle phosphor preferably is used, the semiconductor nanoparticle phosphor may include a first semiconductor nanoparticle phosphor which emits red light and a second semiconductor nanoparticle phosphor which emits green light as in an example shown in FIG. 6. FIG. 6 schematically shows light emitting device 31 including wavelength converter 13' including two types of semiconductor nanoparticle phosphors (a first semiconductor nanoparticle phosphor 14a which emits red light and a second semiconductor nanoparticle phosphor 14b which emits green light) and light source 12 separate from wavelength converter 13' by way of example.

Figure 7:
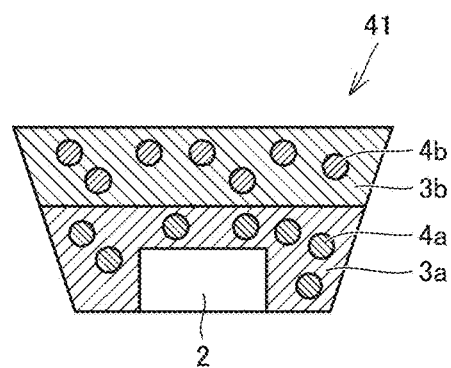
FIG. 7 is a cross-sectional view of a light emitting device according to a preferred embodiment of the present invention.

FIG. 7 is a diagram schematically showing a light emitting device according to an additional preferred embodiment of the present invention. The wavelength converter in the light emitting device according to the present preferred embodiment of the present invention may include a first wavelength conversion layer integrally covering at least a portion of the light source and a second wavelength conversion layer provided adjacently to a side of the first wavelength conversion layer distant from the light source. Namely, the wavelength converter may include the first wavelength conversion layer and the second wavelength conversion layer successively from a side closer to the light source. The light emitting device according to a preferred embodiment of the present invention may also be realized such that any one of the first wavelength conversion layer and the second wavelength conversion layer includes the first semiconductor nanoparticle phosphor which emits red light and the other of the any one of the first wavelength conversion layer and the second wavelength conversion layer includes the second semiconductor nanoparticle phosphor which emits green light. Among others, particularly preferably, a first wavelength conversion layer 3a includes first semiconductor nanoparticle phosphor 4a which emits red light and a second wavelength conversion layer 3b includes second semiconductor nanoparticle phosphor 4b which emits green light, as in a light emitting device 41 in an example shown in FIG. 7.

Figure 8:
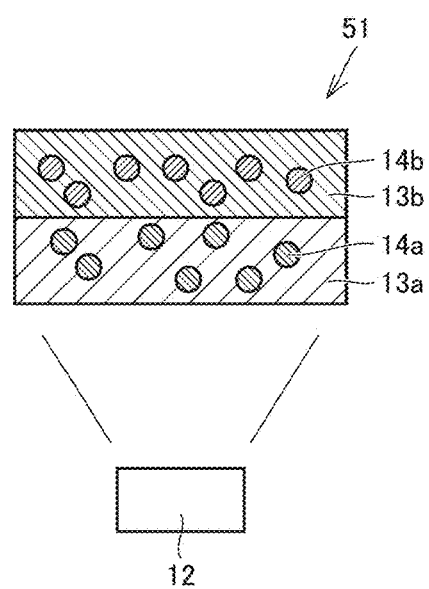
FIG. 8 is a cross-sectional view of a light emitting device according to a preferred embodiment of the present invention.

FIG. 8 is a diagram schematically showing a light emitting device according to another preferred embodiment of the present invention. FIG. 8 shows a light emitting device 51 including a wavelength converter according to another preferred embodiment of the present invention. A wavelength converter according to a preferred embodiment of the present invention may be realized so as to include the first wavelength conversion layer and the second wavelength conversion layer successively from a side receiving excitation light (the side closer to the light source), and any one of the first wavelength conversion layer and the second wavelength conversion layer includes the first semiconductor nanoparticle phosphor which emits red light and the other of the any one of the first wavelength conversion layer and the second wavelength conversion layer includes the second semiconductor nanoparticle phosphor which emits green light. Among others, particularly preferably, a first wavelength conversion layer 13a includes first semiconductor nanoparticle phosphor 14a which emits red light and a second wavelength conversion layer 13b includes second semiconductor nanoparticle phosphor 14b which emits green light as in an example shown in FIG. 8.

Figure 9:
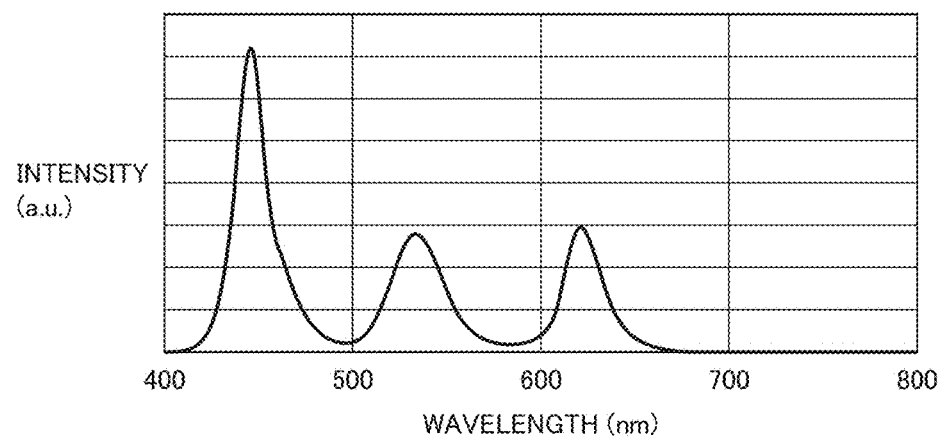
FIG. 9 is a diagram schematically showing one example of an emission spectrum when two types of semiconductor nanoparticle phosphors (first semiconductor nanoparticle phosphors 4*a* and 14*a* which emit red light and second semiconductor nanoparticle phosphors 4*b* and 14*b* which emit green light) are included as phosphors and a light source which emits blue light is included as a light source.

FIG. 9 schematically shows one example of an emission spectrum when two types of semiconductor nanoparticle phosphors (first semiconductor nanoparticle phosphors 4a and 14a which emit red light and second semiconductor nanoparticle phosphors 4b and 14b which emit green light) are used as phosphors and a light source which emits blue light is used as light sources 2 and 12 as described above. In FIG. 9, the abscissa represents a wavelength (nm) and the ordinate represents intensity (a.u.). By thus using light sources 2 and 12 which emit blue light and using the first semiconductor nanoparticle phosphor which emits red light and the second semiconductor nanoparticle phosphor which emits green light as being combined as in the examples shown in FIGS. 5 to 8, a light emitting device which emits white light is able to be realized. In particular, as in the examples shown in FIGS. 7 and 8, first wavelength conversion layers 3a and 13a on the side closer to the light source include first semiconductor nanoparticle phosphors 4a and 14a which emit red light and second wavelength conversion layers 3b and 13b include second semiconductor nanoparticle phosphors 4b and 14b which emit green light, so that first semiconductor nanoparticle phosphors 4a and 14a which are included in first wavelength conversion layers 3a and 13a, respectively and emit red light initially absorb the blue light emitted from light sources 2 and 12 and emit red light, and blue light emission from light sources 2 and 12 and the red light emitted from first semiconductor nanoparticle phosphors 4a and 14a travel to second wavelength conversion layers 3b and 13b whereas second semiconductor nanoparticle phosphors 4b and 14b which are included in second wavelength conversion layers 3b and 13b, respectively and emit green light do not absorb red. Therefore, such an effect that reabsorption by the phosphor is significantly reduced or prevented, efficiency in light emission is improved, and a desired color balance that is readily obtained is achieved.

As in the examples shown in FIGS. 5 to 8, regarding a ratio of content of the first semiconductor nanoparticle phosphor which emits red light and the second semiconductor nanoparticle phosphor which emits green light, in any of a case where they are present as being mixed in one layer and a case where they are contained in two respective layers, in a weight ratio, the second semiconductor nanoparticle phosphor is preferably within a range from about 0.1 to about 10 and preferably within a range from about 0.2 to about 5, with the first semiconductor nanoparticle phosphor being defined as 1. When a weight ratio of the second semiconductor nanoparticle phosphor is lower than about 0.1 with the first semiconductor nanoparticle phosphor being defined as 1, a color of light emission tends to significantly deviate from white and to be closer to red due to a difference in light emission intensity between red and green. When the weight ratio of the second semiconductor nanoparticle phosphor exceeds 10 with the first semiconductor nanoparticle phosphor being defined as 1, a color of light emission tends to significantly deviate from white and to be closer to green due to a difference in light emission intensity between red and green.

Light sources 2 and 12 included in light emitting devices 1, 11, 21, 31, 41, and 51 according to various preferred embodiments of the present invention are not particularly restricted. When the first semiconductor nanoparticle phosphor which emits red light and the second semiconductor nanoparticle phosphor which emits green light as described above are used as being combined, a light emitting device exhibiting white light emission high in color reproducibility is obtained. Therefore, alight emitting diode (LED) which emits blue light and a laser diode (LD) which emits blue light is able to be suitably used.

Figure 10:
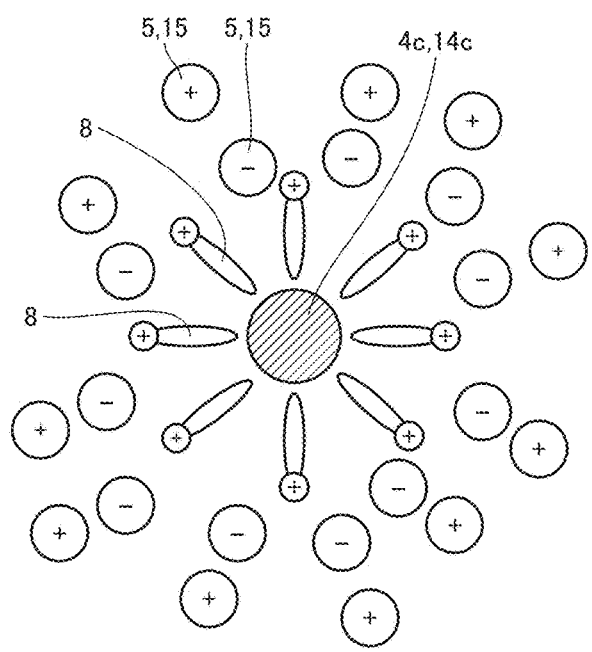
FIG. 10 is a diagram schematically showing a semiconductor nanoparticle phosphor 4*c*, 14*c* when an ionic surface modifying molecule 8 is bonded to a surface thereof.

FIG. 10 is a diagram schematically showing a semiconductor nanoparticle phosphor 4c, 14c when an ionic surface modifying molecule 8 is bonded to a surface thereof. The semiconductor nanoparticle phosphor according to a preferred embodiment of the present invention may have a surface bonded to ionic surface modifying molecule 8 as in an example shown in FIG. 10. The resin including the constitutional unit that includes the ionic liquid or the derivative of the ionic liquid including the polymerizable functional group is obtained by thus bonding the semiconductor nanoparticle phosphor to the ionic surface modifying molecule, further dispersing the semiconductor nanoparticle phosphor in the ionic liquid including the polymerizable functional group, and polymerizing the ionic liquid, so that the semiconductor nanoparticle phosphor is reliably and securely protected while it is electrostatically stabilized in the resin. Thus, a phenomenon of peeling of the surface modifying molecule due to heat is significantly reduced or prevented, and consequently, advantageously, deterioration of the semiconductor nanoparticle phosphor is significantly reduced or prevented.

A conventionally known appropriate ionic surface modifying molecule can be used as the ionic surface modifying molecule without being particularly restricted, and examples thereof can include 2-(diethylamino)ethanethiol hydrochloride, hexadecyltrimethylammonium bromide, myristyltrimethylammonium bromide, thioglycollate salt, and thiocholine bromide. Among these, from a point of view of a cationic surface modifier which can achieve more stable bond, any selected from the group consisting of 2-(diethylamino)ethanethiol hydrochloride, hexadecyltrimethylammonium bromide, myristyltrimethylammonium bromide, and thiocholine bromide is preferably used as the ionic surface modifying molecule.

When the ionic surface modifying molecule is used and when 2-(diethylamino)ethanethiol hydrochloride is used as the ionic surface modifying molecule, a method of bonding the ionic surface modifying molecule to the semiconductor nanoparticle phosphor can include, for example, a method of mixing 2-(diethylamino) ethanethiol hydrochloride as a surface modifier at the time of fabrication of the semiconductor nanoparticle phosphor or a method of mixing the same after the semiconductor nanoparticle phosphor is fabricated.

Though an amount of addition of the ionic surface modifying molecule is not particularly restricted either, an amount of addition is preferably within a range from about 0.1 to about 100 parts by weight and more preferably within a range from about 1 to about 50 parts by weight with respect to 100 parts by weight of the semiconductor nanoparticle phosphor. When an amount of addition of the ionic surface modifying molecule is smaller than about 0.1 part by weight with respect to about 100 parts by weight of the semiconductor nanoparticle phosphor, surface modification tends to be insufficient. When an amount of addition of the ionic surface modifying molecule exceeds 100 parts by weight with respect to 100 parts by weight of the semiconductor nanoparticle phosphor, agglomeration tends to occur due to excessive surface modifying molecules.

Figure 11:
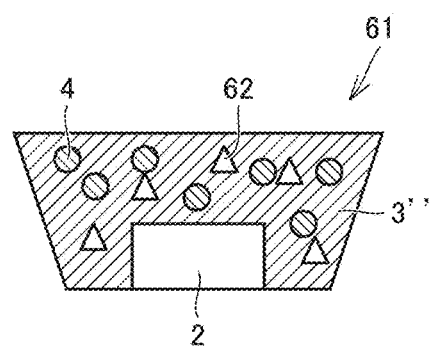
FIG. 11 is a diagram schematically showing a light emitting device according to a preferred embodiment of the present invention.
Figure 12:
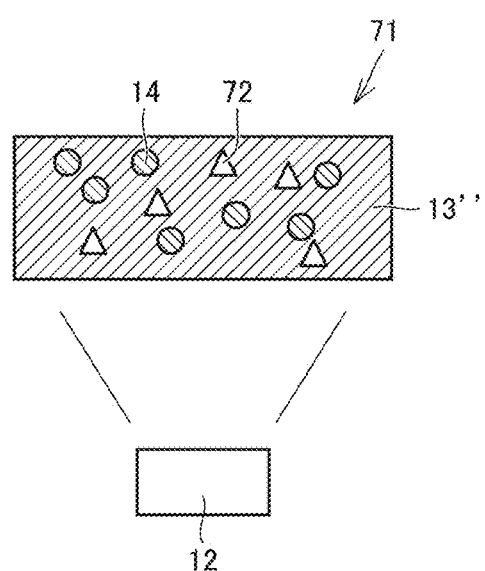
FIG. 12 is a diagram schematically showing a light emitting device according to a preferred embodiment of the present invention.

FIG. 11 is a diagram schematically showing a light emitting device according to a further preferred embodiment of the present invention. FIG. 12 is a diagram schematically showing a light emitting device according to a another preferred embodiment of the present invention. FIG. 12 shows a light emitting device 71 including a wavelength converter 13" according to a preferred embodiment of the present invention. In preferred embodiments of the present invention, a wavelength converter 3" or wavelength converter 13" may further include conventional phosphors 62 and 72 other than semiconductor nanoparticle phosphors 4 and 14 as in a light emitting device 61 in an example shown in FIG. 11 and light emitting device 71 in an example shown in FIG. 12. Examples of such conventional phosphors 62 and 72 include a CaAlSiN$_3$ red phosphor and a YAG:Ce yellow phosphor. Since such conventional phosphors 62 and 72 have a particle size of the order of μm, they scatter fluorescence from the light source and the phosphor. Therefore, light emission from a light emitting device is advantageously more uniform owing to scattering (though the semiconductor nanoparticle phosphor isotropically emits fluorescence, the fluorescence is of the order of nanometer and it does not scatter). Out of conventional phosphors 62 and 72, for such a reason as high stability and light emission characteristics, at least any of the CaAlSiN$_3$ red phosphor and the YAG:Ce yellow phosphor is preferably used.

When conventional phosphors 62 and 72 are used as in the examples shown in FIGS. 11 and 12, a content thereof is preferably within a range from about 1 to about 1000 parts by weight and more preferably within a range from about 10 to about 100 parts by weight with respect to 100 parts by weight of the semiconductor nanoparticle phosphor (a total amount when two or more types of semiconductor nanoparticle phosphors are used as described above). When a content of conventional phosphors 62 and 72 is smaller than about 1 part by weight with respect to 100 parts by weight of the semiconductor nanoparticle phosphor, an effect of scattering tends to be low. When a content of conventional phosphors 62 and 72 exceeds 1000 parts by weight with respect to 100 parts by weight of the semiconductor nanoparticle phosphor, light emission from the semiconductor nanoparticle phosphor tends to be less.

Figure 13:
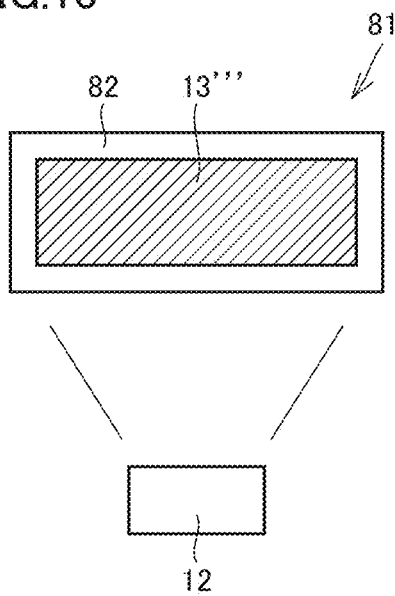
FIG. 13 is a diagram schematically showing a light emitting device according to a preferred embodiment of the present invention.

FIG. 13 is a diagram schematically a light emitting device according to yet another preferred embodiment of the present invention. FIG. 13 shows a light emitting device 81 including a wavelength converter 13''' according to a preferred embodiment of the present invention. Wavelength converter 13''' according to a preferred embodiment of the present invention may further include a translucent gas barrier layer 82. An outermost surface of the wavelength converter is in direct contact with air. By providing gas barrier layer 82 on the outermost surface as in an example shown in FIG. 13, the inside of wavelength converter 13''' is shielded by gas barrier layer 82 against oxygen and moisture present in air. Thus, the wavelength converter including the semiconductor nanoparticle phosphor is protected against deterioration due to oxygen and moisture and a light emitting device including improved reliability is provided.

Figure 14:
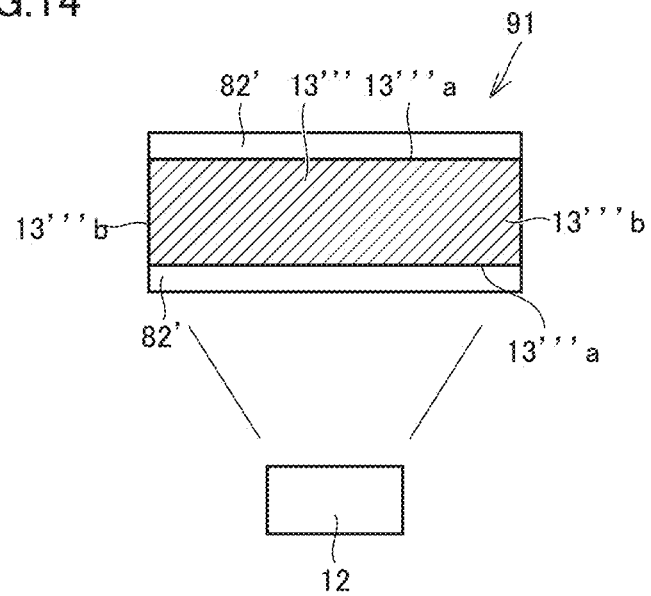
FIG. 14 is a diagram schematically showing a light emitting device according to a preferred embodiment of the present invention.

FIG. 14 is a diagram schematically showing a light emitting device according to an additional preferred embodiment of the present invention. FIG. 14 shows a light emitting device 91 including wavelength converter 13''' as shown in FIG. 13. Wavelength converter 13''' is preferably in a form of a sheet including two opposing main surfaces 13'''a, and a gas barrier layer 82' is provided on each of these two main surfaces 13'''a and exposes side portions 13'''b. No gas barrier layer is provided on the side portion, so that the side portion is able to emit light when a main surface on one side of wavelength converter 13''' defines and functions as a surface irradiated with light emission (for example, an upper surface, which is a main surface located on an upper side of FIG. 14). Since there is no barrier layer on the side portion of wavelength converter 13''', there is no non-light emitting portion in that portion (there is no frame) and efficiency in light emission is enhanced. In various preferred embodiments of the present invention, as described above, the semiconductor nanoparticle phosphor is dispersed in the resin including the constitutional unit that includes the ionic liquid or the derivative of the ionic liquid including the polymerizable functional group, so that the semiconductor nanoparticle phosphor is less likely to deteriorate even when the side portion of the wavelength converter in the form of the sheet is exposed and hence such a construction can be adopted.

Figure 15:
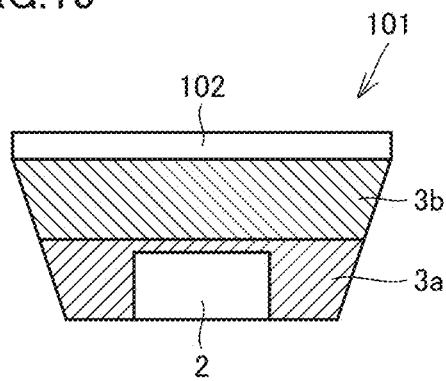
FIG. 15 is a diagram schematically showing a light emitting device according to a preferred embodiment of the present invention.

FIG. 15 is a diagram schematically showing a light emitting device according to another preferred embodiment of the present invention. In a light emitting device 101 in an example shown in FIG. 15, a translucent gas barrier layer 102 may be provided adjacently to a side of the wavelength converter distant from the light source (in the example shown in FIG. 15, a side of second wavelength conversion layer 3b opposite to first wavelength conversion layer 3a closer to light source 2). Though an outermost surface of the light emitting device is in direct contact with air, the gas barrier layer is provided on the outermost surface as in the example shown in FIG. 15, so that the inside of the light emitting device is shielded by the gas barrier layer against oxygen and moisture present in air. Thus, the wavelength converter including the semiconductor nanoparticle phosphor is protected against deterioration due to oxygen and moisture and a light emitting device including improved reliability is provided.

Gas barrier layers 82, 82', and 102 are not particularly restricted so long as they are translucent and have a gas permeability not higher than about 1 cc/(m$^2$·day/atm) as expressed as oxygen permeability and not higher than about 1 g/m$^2$·day as expressed as water vapor permeability (measured with a gas permeability measurement apparatus in conformity with Japanese Industrial Standards), and a gas barrier layer composed mainly of any material selected from the group consisting of glass, a silicone resin, and an acrylic resin is suitable. Though a thickness of gas barrier layers 82, 82' and 102 is not particularly restricted, the thickness is preferably within a range from about 1 µm to about 5000 µm and more preferably within a range from about 10 µm to about 1000 µm, for example. When gas barrier layers 82, 82', and 102 have a thickness smaller than about 1 µm, gas barrier performance does not tend to sufficiently be maintained. When gas barrier layers 82, 82', and 102 have a thickness exceeding about 5000 µm, efficiency in extraction of light tends to be lowered.

A scattering agent including an inorganic material is preferably dispersed in gas barrier layers 82, 82', and 102. As the scattering agent is thus dispersed, as compared with a gas barrier layer without a scattering agent, permeability of a gas such as oxygen or moisture in air is significantly reduced or prevented and a wavelength converter is further protected. Furthermore, advantageously, light emission from the light source and the wavelength converter is scattered and uniform light emission is realized.

The inorganic material to define and function as the scattering agent is not particularly restricted either, and examples thereof include titanium oxide, aluminum oxide, silicon oxide, barium titanate, gallium oxide, indium oxide, and zinc oxide which have conventionally been known. Among these, for such a reason as ease in fabrication and handleability, silicon oxide is preferably used as a scattering agent. Though an amount of addition of the scattering agent is not particularly restricted either, in order to suitably exhibit the effect of the scattering agent described above, the amount of addition is preferably within a range from about 0.1 to about 100 parts by weight and more preferably within a range from about 1 to about 50 parts by weight with respect to 100 parts by weight of a material which is a main component forming the gas barrier layer.

Figure 16:
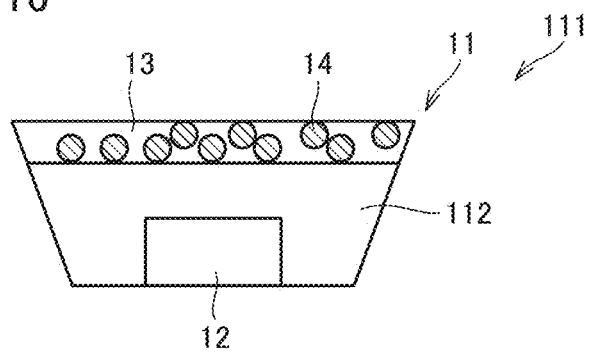
FIG. 16 is a diagram schematically showing a light emitting device according to a preferred embodiment of the present invention.

FIG. 16 is a diagram schematically showing a light emitting device according to another preferred embodiment of the present invention. In a light emitting device 111 in an example shown in FIG. 16, at least a portion of light source 12 is integrally covered with a resin layer 112 including the resin including the constitutional unit that includes the ionic liquid or the derivative of the ionic liquid including the polymerizable functional group and a wavelength converter 11 is provided adjacently to a side of resin layer 112 distant from light source 12. Though the wavelength converter may be a wavelength converter in any preferred embodiment described above, FIG. 16 shows an example in which wavelength converter 11 which contains resin 13 including the constitutional unit that includes the ionic liquid or the derivative of the ionic liquid including the polymerizable functional group and semiconductor nanoparticle phosphor 14 dispersed in resin 13 shown in FIG. 2 is used. With the example shown in FIG. 16, the semiconductor nanoparticle phosphor can be distant from the light source which defines and functions as a heat source and deterioration of the semiconductor nanoparticle phosphor due to heat is significantly reduced or prevented. For example, light emitting device 111 as shown in FIG. 16 may be manufactured by placing a wavelength converter according to a preferred embodiment of the present invention on an LED device including light source 12 and resin layer 112.

Though the wavelength converter is preferably in a form of a sheet as shown in FIG. 14, a shape of the wavelength converter is not particularly restricted, and a shape like a bar or a capillary may be acceptable in addition to a shape of a sheet.

Shapes of light emitting devices according to various preferred embodiments of the present invention are not particularly restricted, and can be any shape including a sheet or a bar.

Preferred embodiments of the present invention will further specifically be described with reference to Examples. Examples, however, do not limit preferred embodiments of the present invention.

Example 1

A semiconductor nanoparticle phosphor including CdSe/ZnS was manufactured according to a procedure below.

Initially, 1 mmol of trioctylphosphine selenide (TOPSe) and 1 mmol of dimethylcadmium were mixed into 3 mL of trioctylphosphine (TOP) in an inert atmosphere. Then, 5 g of trioctylphosphine oxide (TOPO) was introduced in the solution heated under nitrogen at 350° C. The temperature immediately dropped to approximately 260° C. In this state, reaction was allowed to continue for 70 minutes and then stopped. A reaction solution was immediately cooled to a room temperature and thus semiconductor nanoparticles (CdSe cores) including CdSe were prepared.

In succession, a ZnS shell layer was formed by adding 3 mL of a TOP solution including 3 mmol of zinc acetate and 3 mmol of sulfur which were source materials for a shell layer to a solution including the CdSe cores prepared with the method above, allowing reaction to continue for 2 hours at 150° C., and cooling the solution to a room temperature. A dispersion liquid including a semiconductor nanoparticle phosphor including CdSe/ZnS was thus obtained.

Then, a CdSe/ZnS-dispersed ionic liquid was formed by mixing 0.1 mL of the dispersion liquid including the semiconductor nanoparticle phosphor including CdSe/ZnS described above into 1 mL of a solution of 2-(methacryloyloxy)-ethyltrimethylammonium bis(trifluoromethanesulfonyl) imide representing the ionic liquid including the (meth) acrylic acid ester group. In this CdSe/ZnS-dispersed ionic liquid, 2 mg of azobisisobutyronitrile was mixed as a catalyst for initiation of polymerization, and the ionic liquid was dropped onto a blue LED (a light source) including a light emission peak wavelength at 445 nm and resinified by being heated for 1 hour at 80° C. A wavelength converter in which the semiconductor nanoparticle phosphor was dispersed in the resin including the constitutional unit that includes the ionic liquid or the derivative of the ionic liquid including the polymerizable functional group was formed, and a light emitting device including the structure as shown in FIG. 1 was fabricated.

Example 2

Dispersion liquids including a green-light-emitting CdSe/ZnS semiconductor nanoparticle phosphor and including a red-light-emitting CdSe/ZnS semiconductor nanoparticle phosphor, respectively, were fabricated, as in reaction of CdSe in Example 1 except that a time period for reaction of CdSe was set to 50 minutes for green and to 100 minutes for red.

Then, 0.05 mL of each of these dispersion liquids was mixed in 1 mL of a solution of 2-(methacryloyloxy)-ethyltrimethylammonium bis(trifluoromethanesulfonyl) imide representing the ionic liquid including the (meth)acrylic acid ester group, and the solution was similarly dropped onto a blue LED and resinified. A light emitting device including the structure as shown in FIG. 5 was thus fabricated. An emission spectrum of the obtained light emitting device was as shown in FIG. 9.

Example 3

Dispersion liquids including a green-light-emitting CdSe/ZnS semiconductor nanoparticle phosphor and including a red-light-emitting CdSe/ZnS semiconductor nanoparticle phosphor, respectively, were fabricated as in Example 2. In Example 3, the green-light-emitting CdSe/ZnS semiconductor nanoparticle phosphor and the red-light-emitting CdSe/ZnS semiconductor nanoparticle phosphor were individually dispersed in ionic liquids including polymerizable functional groups, respectively, and were arranged in the order of a layer (the first wavelength conversion layer) including the red-light-emitting CdSe/ZnS semiconductor nanoparticle phosphor (the first semiconductor nanoparticle phosphor) and a layer (the second wavelength conversion layer) including the green-light-emitting CdSe/ZnS semiconductor nanoparticle phosphor (the second semiconductor nanoparticle phosphor) successively from the side closer to the blue LED (light source).

Initially, 0.05 mL of the dispersion liquid including the red-light-emitting CdSe/ZnS semiconductor nanoparticle phosphor was mixed in 0.5 mL of a solution of 2-(methacryloyloxy)-ethyltrimethylammonium bis(trifluoromethanesulfonyl) imide representing the ionic liquid including the (meth)acrylic acid ester group, and the solution was dropped onto a blue LED (light source) and resinified. A layer including the red-light-emitting CdSe/ZnS semiconductor nanoparticle phosphor was thus formed.

Then, 0.05 mL of the dispersion liquid including the green-light-emitting CdSe/ZnS semiconductor nanoparticle phosphor was mixed in 0.5 mL of a solution of 2-(methacryloyloxy)-ethyltrimethylammonium bis(trifluoromethanesulfonyl) imide representing the ionic liquid including the (meth)acrylic acid ester group, and the solution was resinified. A layer including the green-light-emitting CdSe/ZnS semiconductor nanoparticle phosphor was thus formed on the layer including the red-light-emitting CdSe/ZnS semiconductor nanoparticle phosphor described above. A light emitting device including the structure as shown in FIG. 7 was thus formed.

Example 4

Dispersion liquids including a green-light-emitting CdSe/ZnS semiconductor nanoparticle phosphor and including a red-light-emitting CdSe/ZnS semiconductor nanoparticle phosphor, respectively, were fabricated as in Example 2, and thereafter, ionic surface modifying molecules were bonded to the surface of each of the semiconductor nanoparticle phosphors.

Initially, 1 mmol of TOPSe and 1 mmol of dimethylcadmium were mixed into 3 mL of TOP in an inert atmosphere. Then, 5 g of TOPO was introduced in the solution heated under nitrogen at 350° C. The temperature immediately dropped to approximately 260° C. In this state, reaction was allowed to continue for 70 minutes and then stopped. A reaction solution was immediately cooled to a room temperature and thus semiconductor nanoparticles (CdSe cores) including CdSe were prepared.

In succession, a ZnS shell layer was formed by adding 3 mL of a TOP solution including 3 mmol of zinc acetate and 3 mmol of sulfur which were source materials for a shell layer to a solution including the CdSe cores prepared with the method above, allowing reaction to continue for 2 hours at 150° C., and cooling the solution to a room temperature. A dispersion liquid including a semiconductor nanoparticle phosphor including CdSe/ZnS was thus obtained.

A dispersion liquid including the semiconductor nanoparticle phosphor in which 2-(diethylamino)ethanethiol was bonded to a surface of CdSe/ZnS was obtained by mixing and stirring 1 mL of water, in which 50 mg of 2-(diethylamino)ethanethiol hydrochloride had been mixed as the ionic surface modifying molecules, in this dispersion liquid.

This dispersion liquid was mixed in 1 mL of a solution of 2-(methacryloyloxy)-ethyltrimethylammonium bis(trifluoromethanesulfonyl) imide representing the ionic liquid including the (meth)acrylic acid ester group. After the mixture was stirred for approximately 8 hours, the mixture was dried under a reduced pressure for 2 hours, dropped onto a blue LED (light source), and resinified. A light emitting device including the structure as shown in FIG. 1 in which the semiconductor nanoparticle phosphor present in the wavelength converter had a structure as shown in FIG. 10 was thus obtained.

Example 5

A semiconductor nanoparticle phosphor including InP/ZnS was fabricated in a procedure below.

Hexadecanethiol (1 mmol), (trimethylsilyl)phosphine $(TMS)_3P$ (3 mmol), and 20 ml of 1-octadecene were added to indium myristate (1 mmol), and the mixture was heated for 50 minutes at approximately 180° C. Thus, a dispersion liquid including an InP semiconductor nanoparticle phosphor (an InP core) was prepared.

In succession, 3 mL of a TOP solution including 3 mmol of zinc acetate and 3 mmol of sulfur which were source materials for a shell layer was added to the dispersion liquid including the InP core prepared with the method described above. Reaction was allowed to continue for 32 hours at 150° C., and the dispersion liquid was cooled to a room temperature. A semiconductor nanoparticle phosphor including InP/ZnS was thus obtained. Thereafter, a light emitting device including the structure as shown in FIG. 1 was obtained as in Example 1.

Example 6

The procedure was similar to that in Example 2 except for use of a commercially available $CaAlSiN_3$ red phosphor instead of the red-light-emitting semiconductor nanoparticle phosphor. A light emitting device including the structure as shown in FIG. 11 was obtained by initially mixing 0.05 g of the $CaAlSiN_3$ red phosphor in a solution of 2-(methacryloyloxy)-ethyltrimethylammonium bis(trifluoromethanesulfonyl) imide representing the ionic liquid including the (meth)acrylic acid ester group, in which the green-light-emitting CdSe semiconductor nanoparticle phosphor had been dispersed, and dropping the mixture onto a blue LED (light source) and resinifying the same.

Example 7

A light emitting device including the structure as shown in FIG. 15 was obtained by providing a gas barrier layer on an uppermost portion of the light emitting device obtained in Example 3. The gas barrier layer was formed by applying a silicone resin (KER-2500 manufactured by Shin-Etsu Chemical Co., Ltd.) and heating the silicone resin for 30 minutes at 80° C. and for 1 hour at 120° C.

Comparative Example 1

A light emitting device was fabricated as in Example 1 except that the CdSe/ZnS semiconductor nanoparticle phosphor was dispersed in a PMMA resin. A light emitting device was fabricated by initially preparing a dispersion liquid including the CdSe/ZnS semiconductor nanoparticle phosphor as in Example 1, mixing 0.1 mL of the dispersion liquid including the CdSe/ZnS semiconductor nanoparticle phosphor described above in 5 mL of an acetone solution including 1 g of the PMMA resin, mixing a blue LED including a light emission peak wavelength at 445 nm, and thereafter heating the same for 1 hour at 80° C.

Figure 17:
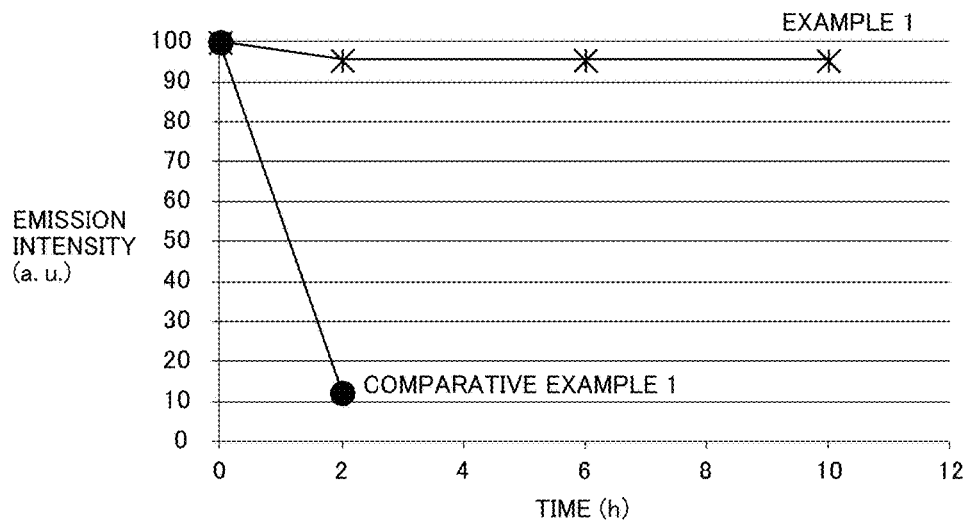
FIG. 17 is a graph showing results of performance tests of Example 1 of a preferred embodiment of the present invention and Comparative Example 1.

Light emission intensity of each of the light emitting devices obtained in Example 1 and Comparative Example 1 was measured. A heat reliability test (85° C.) in conformity with requirements in a high temperature test under Japanese Industrial Standards was conducted with initial light emission intensity being defined as 100%, and variation in light emission intensity of a wavelength converter in each light emitting device was calculated as efficiency in light emission. FIG. 17 shows results.

Example 8

A semiconductor nanoparticle phosphor including CdSe/ZnS was manufactured in a procedure below.

Initially, 1 mmol of trioctylphosphine selenide (TOPSe) and 1 mmol of dimethylcadmium were mixed into 3 mL of trioctylphosphine (TOP) in an inert atmosphere. Then, 5 g of trioctylphosphine oxide (TOPO) was introduced in the solution heated under nitrogen at 350° C. The temperature immediately dropped to approximately 260° C. In this state, reaction was allowed to continue for 70 minutes and then stopped. A reaction solution was immediately cooled to a room temperature and thus semiconductor nanoparticles (CdSe cores) including CdSe were prepared.

In succession, a ZnS shell layer was formed by adding 3 mL of a TOP solution including 3 mmol of zinc acetate and 3 mmol of sulfur which were source materials for a shell layer to a solution including the CdSe cores prepared with the method above, allowing reaction to continue for 2 hours at 150° C., and cooling the solution to a room temperature. A dispersion liquid including a semiconductor nanoparticle phosphor including CdSe/ZnS was thus obtained.

Then, a CdSe/ZnS-dispersed ionic liquid was formed by mixing 0.1 mL of the dispersion liquid including the semiconductor nanoparticle phosphor including CdSe/ZnS described above into 1 mL of a solution of 2-(methacryloyloxy)-ethyltrimethylammonium bis(trifluoromethanesulfonyl) imide representing the ionic liquid including the (meth) acrylic acid ester group. A wavelength converter including the structure as shown in FIG. 2 was fabricated by mixing 2 mg of azobisisobutyronitrile as a catalyst for initiation of polymerization in this CdSe/ZnS-dispersed ionic liquid and resinifying the ionic liquid by heating the same for 1 hour at 80° C.

Example 9

Dispersion liquids including a green-light-emitting CdSe/ZnS semiconductor nanoparticle phosphor and including a red-light-emitting CdSe/ZnS semiconductor nanoparticle phosphor, respectively, were fabricated as in reaction of CdSe in Example 8 except that a time period for reaction of CdSe was set to 50 minutes for green and to 100 minutes for red.

Then, the wavelength converter including the structure as shown in FIG. 2 was fabricated by mixing 0.05 mL of each of these dispersion liquids in 1 mL of a solution of 2-(methacryloyloxy)-ethyltrimethylammonium bis(trifluoromethanesulfonyl) imide representing the ionic liquid including the (meth)acrylic acid ester group and resinifying the solution. This wavelength converter was combined with a blue LED (an excitation light source) including a light emission peak wavelength at 445 nm, and a light emitting device shown in FIG. 6 was obtained. An emission spectrum of the obtained light emitting device was as shown in FIG. 9.

Example 10

Dispersion liquids including a green-light-emitting CdSe/ZnS semiconductor nanoparticle phosphor and including a red-light-emitting CdSe/ZnS semiconductor nanoparticle phosphor, respectively, were fabricated as in Example 9. In Example 10, the green-light-emitting CdSe/ZnS semiconductor nanoparticle phosphor and the red-light-emitting CdSe/ZnS semiconductor nanoparticle phosphor were individually dispersed in ionic liquids including polymerizable functional groups, respectively, and were arranged in the order of a layer (the first wavelength conversion layer) including the red-light-emitting CdSe/ZnS semiconductor nanoparticle phosphor (the first semiconductor nanoparticle phosphor) and a layer (the second wavelength conversion layer) including the green-light-emitting CdSe/ZnS semiconductor nanoparticle phosphor (the second semiconductor nanoparticle phosphor) successively from the side receiving excitation light.

Initially, a layer including the red-light-emitting CdSe/ZnS semiconductor nanoparticle phosphor was formed by mixing 0.05 mL of the dispersion liquid including the red-light-emitting CdSe/ZnS semiconductor nanoparticle phosphor in 0.5 mL of a solution of 2-(methacryloyloxy)-ethyltrimethylammonium bis(trifluoromethanesulfonyl) imide representing the ionic liquid including the (meth) acrylic acid ester group and resinifying the solution.

Then, a layer including the green-light-emitting CdSe/ZnS semiconductor nanoparticle phosphor was formed on the layer including the red-light-emitting CdSe/ZnS semiconductor nanoparticle phosphor described above by mixing 0.05 mL of the dispersion liquid including the green-light-emitting CdSe/ZnS semiconductor nanoparticle phosphor in 0.5 mL of a solution of 2-(methacryloyloxy)-ethyltrimethylammonium bis(trifluoromethanesulfonyl) imide representing the ionic liquid including the (meth)acrylic acid ester group and resinifying the solution. A wavelength converter including the structure as shown in FIG. 8 was thus fabricated.

Example 11

Dispersion liquids including a green-light-emitting CdSe/ZnS semiconductor nanoparticle phosphor and including a red-light-emitting CdSe/ZnS semiconductor nanoparticle phosphor, respectively, were fabricated as in Example 9, and thereafter, ionic surface modifying molecules were bonded to the surface of each of the semiconductor nanoparticle phosphors.

Initially, 1 mmol of TOPSe and 1 mmol of dimethylcadmium were mixed into 3 mL of TOP in an inert atmosphere. Then, 5 g of TOPO was introduced in the solution heated under nitrogen at 350° C. The temperature immediately dropped to approximately 260° C. In this state, reaction was allowed to continue for 70 minutes and then stopped. A reaction solution was immediately cooled to a room temperature and thus semiconductor nanoparticles (CdSe cores) including CdSe were prepared.

In succession, a ZnS shell layer was formed by adding 3 mL of a TOP solution including 3 mmol of zinc acetate and 3 mmol of sulfur which were source materials for a shell layer to a solution including the CdSe cores prepared with the method above, allowing reaction to continue for 2 hours at 150° C., and cooling the solution to a room temperature. A dispersion liquid including the semiconductor nanoparticle phosphor including CdSe/ZnS was thus obtained.

A dispersion liquid including the semiconductor nanoparticle phosphor in which 2-(diethylamino)ethanethiol was bonded to a surface of CdSe/ZnS was obtained by mixing and stirring 1 mL of water, in which 50 mg of 2-(diethylamino)ethanethiol hydrochloride was mixed as the ionic surface modifying molecules, in this dispersion liquid.

This dispersion liquid was mixed in 1 mL of a solution of 2-(methacryloyloxy)-ethyltrimethylammonium bis(trifluoromethanesulfonyl) imide representing the ionic liquid including the (meth)acrylic acid ester group. After the dispersion liquid was stirred for approximately 8 hours, the dispersion liquid was dried under a reduced pressure for 2 hours and resinified. A wavelength converter including the structure as shown in FIG. 2 in which the semiconductor nanoparticle phosphor present therein had a structure as shown in FIG. 10 was thus obtained.

Example 12

A semiconductor nanoparticle phosphor including InP/ZnS was fabricated in a procedure below.

Hexadecanethiol (1 mmol), (trimethylsilyl)phosphine (TMS)$_3$P (3 mmol), and 20 ml of 1-octadecene were added to indium myristate (1 mmol), and the mixture was heated for 50 minutes at approximately 180° C. Thus, a dispersion liquid including an InP semiconductor nanoparticle phosphor (an InP core) was prepared.

In succession, 3 mL of a TOP solution including 3 mmol of zinc acetate and 3 mmol of sulfur which were source materials for a shell layer was added to the dispersion liquid including the InP core prepared with the method described above. Reaction was allowed to continue for 32 hours at 150° C., and the dispersion liquid was cooled to a room temperature. A semiconductor nanoparticle phosphor including InP/ZnS was thus obtained. Thereafter, a wavelength converter including the structure as shown in FIG. 2 was obtained as in Example 8.

Example 13

The procedure was similar to that in Example 9 except for use of a commercially available CaAlSiN$_3$ red phosphor instead of the red-light-emitting semiconductor nanoparticle phosphor. A wavelength converter including the structure as shown in FIG. 12 was obtained by initially mixing 0.05 g of the CaAlSiN$_3$ red phosphor in a solution of 2-(methacryloyloxy)-ethyltrimethylammonium bis(trifluoromethanesulfonyl) imide representing the ionic liquid including the (meth)acrylic acid ester group, in which the green-light-emitting CdSe semiconductor nanoparticle phosphor had been dispersed.

Example 14

A wavelength converter including the structure as shown in FIG. 13 was obtained by providing a gas barrier layer on the entire surface of the wavelength converter obtained in Example 10. The gas barrier layer was formed by applying a silicone resin (KER-2500 manufactured by Shin-Etsu Chemical Co., Ltd.) to the entire surface of the wavelength converter and heating the silicone resin for 30 minutes at 80° C. and for 1 hour at 120° C.

Example 15

A wavelength converter including the structure as shown in FIG. 14 in which a gas barrier layer was provided on each of two main surfaces of the wavelength converter (the wavelength converter obtained in Example 10) in a form of a sheet and side portions were exposed was obtained. The gas barrier layer was formed by applying a silicone resin (KER-2500 manufactured by Shin-Etsu Chemical Co., Ltd.) to each of the two main surfaces of the wavelength converter and heating the silicone resin for 30 minutes at 80° C. and for 1 hour at 120° C.

Example 16

A blue LED was separately provided as a light source for exciting the wavelength converter obtained in Example 8, and a light emitting device shown in FIG. 2 was obtained.

Example 17

A blue LED as an excitation light source was provided separately for a wavelength converter including a two-layered structure obtained in Example 10, on a side including the red-light-emitting semiconductor nanoparticle phosphor (on the side of the first wavelength conversion layer), and a light emitting device shown in FIG. 8 was obtained.

Comparative Example 2

A light emitting device was fabricated as in Example 8 except that the CdSe/ZnS semiconductor nanoparticle phosphor was dispersed in a PMMA resin. A wavelength converter was fabricated by initially preparing a dispersion liquid including the CdSe/ZnS semiconductor nanoparticle phosphor as in Example 8, mixing 0.1 mL of the dispersion liquid including the CdSe/ZnS semiconductor nanoparticle phosphor described above in 5 mL of an acetone solution including 1 g of the PMMA resin, and heating the mixture for 1 hour at 80° C. A light emitting device was obtained by providing a blue LED separately as an excitation light source for exciting the obtained wavelength converter.

Figure 18:
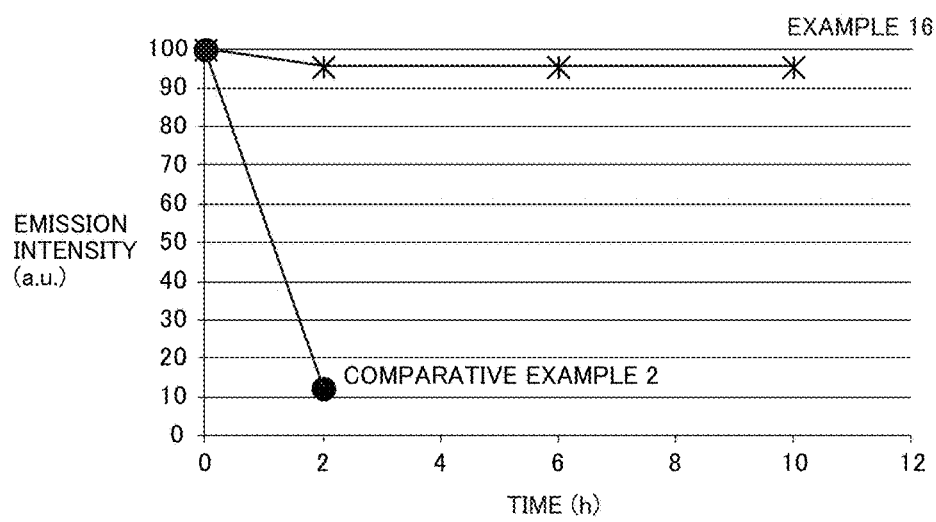
FIG. 18 is a graph showing results of performance tests of Example 16 of a preferred embodiment of the present invention and Comparative Example 2.

Light emission intensity of each of the light emitting devices obtained in Example 16 and Comparative Example 2 was measured. A heat reliability test (85° C.) in conformity with requirements in a high temperature test under Japanese Industrial Standards was conducted with initial light emission intensity being defined as 100%, and variation in light emission intensity of a wavelength converter in each light emitting device was calculated as efficiency in light emission. FIG. 18 shows results.

Example 18

A semiconductor nanoparticle phosphor including CdSe/ZnS was manufactured in a procedure below.

Initially, 1 mmol of trioctylphosphine selenide (TOPSe) and 1 mmol of dimethylcadmium were mixed into 3 mL of trioctylphosphine (TOP) in an inert atmosphere. Then, 5 g of trioctylphosphine oxide (TOPO) was introduced in the solution heated under nitrogen at 350° C. The temperature immediately dropped to approximately 260° C. In this state, reaction was allowed to continue for 70 minutes and then stopped. A reaction solution was immediately cooled to a room temperature and thus semiconductor nanoparticles (CdSe cores) including CdSe were prepared.

In succession, a ZnS shell layer was formed by adding 3 mL of a TOP solution including 3 mmol of zinc acetate and 3 mmol of sulfur which were source materials for a shell layer to a solution including the CdSe cores prepared with the method above, allowing reaction to continue for 2 hours at 150° C., and cooling the solution to a room temperature. A dispersion liquid including a semiconductor nanoparticle phosphor including CdSe/ZnS was thus obtained.

Then, a CdSe/ZnS-dispersed ionic liquid was formed by mixing 0.1 mL of the dispersion liquid including the semiconductor nanoparticle phosphor including CdSe/ZnS described above into 1 mL of a solution of 2-(methacryloyloxy)-ethyltrimethylammonium bis(trifluoromethanesulfonyl) imide representing the ionic liquid including the (meth) acrylic acid ester group. A wavelength converter including the structure as shown in FIG. 2 was fabricated by mixing 2 mg of azobisisobutyronitrile as a catalyst for initiation of polymerization in this CdSe/ZnS-dispersed ionic liquid and resinifying the ionic liquid by heating the same for 1 hour at 80° C. FIG. 3 shows a transmission electron microscope (TEM) photograph (×100,000) of the obtained wavelength converter. As described above, it could be observed that the semiconductor nanoparticle phosphor was dispersed in the resin as forming an assembly in a form of a cluster (what is called self-organization) without contact with each other.

A light emitting device was obtained by combining the obtained wavelength converter with a blue LED (an excitation light source) including a light emission peak wavelength at 445 nm.

Example 19

A semiconductor nanoparticle phosphor including CdSe/ZnS was manufactured in a procedure below.

Initially, 1 mmol of trioctylphosphine selenide (TOPSe) and 1 mmol of dimethylcadmium were mixed into 3 mL of trioctylphosphine (TOP) in an inert atmosphere. Then, 5 g of trioctylphosphine oxide (TOPO) was introduced in the solution heated under nitrogen at 350° C. The temperature immediately dropped to approximately 260° C. In this state, reaction was allowed to continue for 70 minutes and then stopped. A reaction solution was immediately cooled to a room temperature and thus semiconductor nanoparticles (CdSe cores) including CdSe were prepared.

In succession, a ZnS shell layer was formed by adding 3 mL of a TOP solution including 3 mmol of zinc acetate and 3 mmol of sulfur which were source materials for a shell layer to a solution including the CdSe cores prepared with the method above, allowing reaction to continue for 2 hours at 150° C., and cooling the solution to a room temperature. A dispersion liquid including the semiconductor nanoparticle phosphor including CdSe/ZnS was thus obtained.

Then, a CdSe/ZnS-dispersed ionic liquid was formed by mixing 0.1 mL of the dispersion liquid including the semiconductor nanoparticle phosphor including CdSe/ZnS described above into 1 mL of a solution of 2-(methacryloyloxy)-ethyltrimethylammonium bis(trifluoromethanesulfonyl) imide representing the ionic liquid including the (meth) acrylic acid ester group. In this CdSe/ZnS-dispersed ionic liquid, 2 mg of azobisisobutyronitrile as a catalyst for initiation of polymerization was mixed, and the mixture was dropped onto a blue LED (light source) including a light emission peak wavelength at 445 nm and resinified by being heated for 1 hour at 80° C. A wavelength converter in which the semiconductor nanoparticle phosphor was dispersed in the resin including the constitutional unit that includes the ionic liquid or the derivative of the ionic liquid including the polymerizable functional group was formed and a light emitting device including the structure as shown in FIG. 1 was fabricated.

Comparative Example 3

A light emitting device (a conventional light emitting device) was obtained as in Example 1 in Japanese Patent Laying-Open No. 2015-113360.

Figure 19:
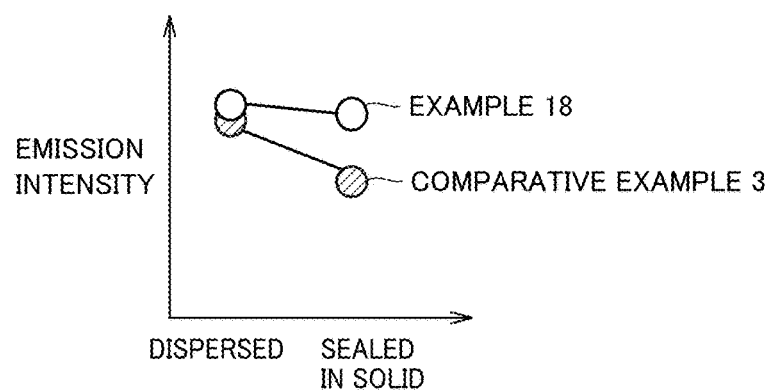
FIG. 19 is a graph showing results of performance tests of Example 18 of a preferred embodiment of the present invention and Comparative Example 3.

Light emission intensity of each of the light emitting devices obtained in Example 18 and Comparative Example 3 was compared in a state that the semiconductor nanoparticle phosphor was dispersed in a dispersion medium ("dispersed" in the figure) and a state that the semiconductor nanoparticle phosphor was sealed in a solid layer with a resin ("sealed in solid" in the figure). FIG. 19 described above shows a graph showing results. It can be seen in FIG. 19 that the conventional light emitting device in the state of being sealed in a solid was remarkably low in efficiency in light emission, whereas the light emitting device according to the present invention in the state of being sealed in a solid was suppressed in lowering in efficiency in light emission, with the semiconductor nanoparticle phosphors being dispersed in the resin as forming an assembly in a form of a cluster without contact therebetween.

It should be understood that the preferred embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A light emitting device comprising:
a light source;
a wavelength converter that includes a resin including a constitutional unit that includes an ionic liquid or a derivative of the ionic liquid, and a semiconductor nanoparticle phosphor included in the resin and provided on at least a portion of the light source; and
a first wavelength conversion layer and a second wavelength conversion layer arranged in order successively from a side closer to the light source; wherein
the semiconductor nanoparticle phosphor includes a first semiconductor nanoparticle phosphor which emits red light and a second semiconductor nanoparticle phosphor which emits green light; and
any one of the first wavelength conversion layer and the second wavelength conversion layer includes the first semiconductor nanoparticle phosphor which emits red light and the other of the any one of the first wavelength conversion layer and the second wavelength conversion layer includes the second semiconductor nanoparticle phosphor which emits green light.

2. The light emitting device according to claim 1, wherein the first wavelength conversion layer includes the first semiconductor nanoparticle phosphor which emits red light and the second wavelength conversion layer includes the second semiconductor nanoparticle phosphor which emits green light.

3. The light emitting device according to claim 1, wherein the light source emits blue light and the light emitting device emits white light.

* * * * *

UNITED STATES PATENT AND TRADEMARK OFFICE
CERTIFICATE OF CORRECTION

PATENT NO. : 10,174,886 B2  
APPLICATION NO. : 15/208818  
DATED : January 8, 2019  
INVENTOR(S) : Tatsuya Ryohwa et al.

Page 1 of 1

It is certified that error appears in the above-identified patent and that said Letters Patent is hereby corrected as shown below:

On the Title Page

Item (54) and in the Specification, Column 1, Lines 1-2, the Title of the Invention should be listed as follows:
--Wavelength Converter and Light Emitting Device--

Item (73) Assignee, the second Assignee should be listed as follows:
--National University Corporation Nara Institute of Science and Technology, Nara (JP)--

Signed and Sealed this  
Twenty-fifth Day of June, 2019

Andrei Iancu  
*Director of the United States Patent and Trademark Office*